United States Patent [15] 3,637,382
Krauch [45] Jan. 25, 1972

[54] PLATES, SHEETING AND FILM OF PHOTOPOLYMERIZABLE COMPOSITIONS CONTAINING INDIGOID DYES

[72] Inventor: Carl Heinrich Krauch, Heidelberg, Germany

[73] Assignee: Badische Anilin- & Soda-Fabrik Aktiengesellschaft, Ludwigshafen/Rhine, Germany

[22] Filed: Sept. 20, 1968

[21] Appl. No.: 761,343

[30] Foreign Application Priority Data

Sept. 22, 1967 Germany ......................P 16 69 723.7

[52] U.S. Cl. ..................................96/35.1, 96/89, 96/115 P
[51] Int. Cl. ..........................................................G03c 1/68
[58] Field of Search ....................96/89, 115 P, 35.1, 86 P, 87

[56] References Cited

UNITED STATES PATENTS

| | | | |
|---|---|---|---|
| 2,760,803 | 8/1956 | Plambeck | 96/84 |
| 2,964,401 | 12/1960 | Plambeck | 96/35.1 |
| 2,993,789 | 7/1961 | Crawford | 96/35.1 |
| 3,060,025 | 10/1962 | Burg et al. | 96/115 |
| 3,070,442 | 12/1962 | Cohen et al | 96/35.1 |
| 3,099,558 | 7/1963 | Levinos | 96/115 X |
| 3,218,167 | 11/1965 | Burg et al. | 96/35.1 |

FOREIGN PATENTS OR APPLICATIONS

| | | | |
|---|---|---|---|
| 695,197 | 8/1953 | Great Britain | 96/35.1 |
| 741,294 | 11/1955 | Great Britain | 96/35.1 |
| 945,673 | 1/1956 | Germany | 96/33 |
| 567,014 | 12/1958 | Canada | 96/115 |
| 756,547 | 4/1967 | Canada | 96/115 |

*Primary Examiner*—William D. Martin
*Assistant Examiner*—Mathew R. P. Perrone, Jr.
*Attorney*—Marzall, Johnston, Cook & Root

[57] ABSTRACT

Improved solid or semisolid photopolymerizable layers for use in producing relief printing plates, said layers including a photopolymerizable compound having at least two polymerizable olefinic double bonds, a photoinitiator, and an indigoid dye, and a process for determining the light sensitivity of said layer by using said indigoid dye as a color indicator whereby the amount of exposure required to photopolymerize the layer by irradiation is accurately determined.

12 Claims, No Drawings

PLATES, SHEETING AND FILM OF PHOTOPOLYMERIZABLE COMPOSITIONS CONTAINING INDIGOID DYES

This invention relates to plates, sheeting or film of photopolymerizable compositions which contain indigoid dyes as indicators.

It is known that relief plates for printing purposes can be prepared by exposing through an image-bearing transparency a plate sheeting or film of a mixture of a highly polymerized substance with an unsaturated monomer containing more than one photopolymerizable double bond and a photoinitiator, and removing the unexposed areas with a suitable solvent down to the desired depth of the relief. These relief plates are suitable for relief printing and dry offset printing.

It is also known that relief plates for printing purposes may be made from plates, sheeting or film of mixtures of linear saturated synthetic polyamides, monomers having at least two double bonds and photoinitiators.

The light sensitivity of such plates (i.e., their property of changing into the insoluble condition at the exposed areas under the action of light) declines slowly with time because a slow polymerization and cross linking of the material of the plate takes place in spite of added inhibitors of various types. This produces the difficulty in practice that the light sensitivity of the plate material to be processed always has to be determined again prior to processing because a satisfactory hard printing relief is not formed when there is underexposure. For this purpose it is necessary to carry out the entire development process of the material in order to determine experimentally the exposure time for the lowered light sensitivity. This test is extremely time-consuming and also involves an appreciable waste of material because in most cases a series of tests is necessary.

We have now found that in the case of plates, sheeting and film of photopolymerizable compositions containing indigoid dyes which contain photopolymerizable compounds having at least two polymerizable olefinic double bonds, the exposure time required to cure the photopolymerizable layer can be determined with the naked eye, if necessary by comparison with an appropriately calibrated color scale.

Indigoid dyes in accordance with this invention are all those dyes which contain the basic skeleton of indigo or thioindigo, particularly indigo containing halogen atoms and particularly chlorine and/or bromine atoms as substituents such as 4,4′-dichloroindigo, 5,5′-dibromoindigo, 5,5′, 7,7′-tetrachloroindigo or 4,4′-dichloro-5,5′-dibromoindigo, thioindigo and indigosulfonic acids and their salts.

Photopolymerizable layers which contain these dyes discolor or change their absorption characteristic in the areas where they have been exposed to light. From the exposure time required to produce discoloration or from the shade of color present after a definite exposure time, it is possible to determine the exposure time required to complete the cure of the layer, if necessary by comparison with appropriate calibration curves specific to the product. Development of samples prepared with different exposure times and the testing of the finished relief are not necessary.

It is particularly favorable to use a dye having as dark a color as possible if the reaction product of the dye resulting from exposure does not absorb in the visible spectral region, because the picture formed then exhibit black-white characteristics.

The dye added depends on its extinction coefficients. The amount added is within the range from 0.001 to 5.0 percent, preferably from 0.01 to 1 percent, by weight with reference to the weight of the photopolymerizable layer. If the dye has an absorption gap in the range of the absorption of the photopolymerization initiator (present in the layer), more dye can be added.

Another advantage of layers containing indigoid dyes is that after exposure through the image-bearing transparency, the image is already visible on the photopolymerizable material. The exposure time required up to the appearance of a clear image on the light sensitive plate is directly proportional to the case of polymerization of the layer.

Plates, sheeting or film or layers of photopolymerizable compositions containing indigoid dyes in accordance with this invention preferably consist of a solid or semisolid mixture of a synthetic or semisynthetic polymer, a monomer having at least two polymerizable olefinic double bonds, with or without monoolefinically unsaturated monomers, photoinitiators and/or polymerization inhibitors.

The polymers, generally forming the basic material, all synthetic or semisynthetic polymers may be used which are described in the literature for the production of photopolymerizable layers, particularly for the production of relief printing plates. Examples are vinyl polymers such as polyvinyl chloride, vinylidene chloride polymers, copolymers or vinyl chloride and vinyl alcohol or vinyl esters of monocarboxylic acids polymers of major proportions of vinyl carboxylates in which the olefinically unsaturated grouping may also be present in the acidic portion of the molecule, such as acrylic and methacrylic acids or their derivatives, particular the amides and esters for example acrylamide, methacrylamide or acrylic or methacrylic alkyl esters having one to eight carbon atoms in the alkyl radical; polystyrene and polymers of vinyl esters of aliphatic monocarboxylic acids having two to 11 carbon atoms such as vinyl acetate and vinyl chloroacetate, methacrylic or acrylic mono esters of an aliphatic diol having two to 12 carbon atoms, such as ethylene glycol, 1,2 propylene glycol or butane diol—1.4 and higher polyfunctional alcohols such as glycerine, polyesters or alkyd resins from such alcohols and polybasic carboxylic acids and also cellulose esters and ethers.

Photopolymerizable layers based on synthetic linear polyamides which contain recurring $$-\underset{\underset{O}{\|}}{C}-\underset{\underset{H}{|}}{N}-$$

groups in the main chain of the molecule are particularly suitable. These polyamides are preferably copolyamides which are soluble in conventional solvents or solvent mixtures such as in lower aliphatic alcohols or mixtures of alcohol and water, ketones, aromatics or mixtures of benzene, alcohol and water, for example copolymides which have been prepared by polycondensation or activated anionic polymerization from two or more lactams having five to seven ring members such as caprolactam, oenantolactam, capryllactam and laurolactam or corresponding carbon-substituted lactams. Aminocarboxlic acids on which the lactams are based may be polycondensed instead of the lactams themselves. Other suitable copolyamides are polycondensation products of salts of the type diamine/dicarboxylic acid which have been prepared from at least three polyamide-forming starting materials. Suitable dicarboxylic acids are preferably aliphatic dicarboxylic acids having four to 20 carbon atoms, for example adipic acid, suberic acid, sebacic acid, dodecane dicarboxylic acid and corresponding substitution products such as $\alpha,\alpha$-diethyladipic acid, $\alpha$-ethylsuberic acid, heptadecane dicarboxylic acid-(1,8) or heptadecane dicarboxylic acid-(1,9) or mixtures of the same, and also dicarboxylic acids containing aliphatic or aromatic ring systems. Particularly suitable diamines are aliphatic or cyclialiphatic diamines having two primary and/or secondary amino groups, particularly with four to 20 carbon atoms, such as pentamethylenediamine, hexamethylenediamine, heptamethylenediamine, octamethylenediamine or C-substituted and/or N-substituted derivatives of these amines such as N-methyl-N-ethylhexamethylenediamine, 1,6-diamino-3-methylhexane or 4,4′-diaminodicyclohexylmethane; also aromatic diamines such as metaphenylenediamine, metaxylylenediamine, 4,4′-diaminodiphenylmethane. The bridging members between the two carboxylic acid groups or amino groups in the cyclic and aromatic dicarboxylic acids or diamines may be interrupted by heteroatoms such as oxygen or nitrogen. Particularly suitable copolyamides are those which have been prepared by cocondensation of a mixture of one or more lactams and at least one dicarboxylic acid-diamine salt, for example epsilon-caprolactam, hexamethylene diammonium adipate and 4,4'-diaminodicyclohexylmethane adipate.

Monomers which contain not only double bonds but also amido groups such as methylene-bis-acrylamide, methylene-bis-methacrylamide and also the bisacrylamides or bismethacrylamides of ethylenediamine, propylenediamine, butyelendiamine, pentamethylenediamine, hexamethylenediamine, heptamethylenediamine, octamethylenediamine and also of polyamines and other diamines which may be branched, interrupted by heteroatoms or may contain cyclic systems are very suitable monomers containing at least two polymerizable olefinic double bonds. Monomers which contain urethane or urea groups in addition to amide groups are also very suitable. The copolymerizable monoolefinically unsaturated monomers which may be used in minor amounts in addition to the said monomers may be conventional monomers such as acrylamide, methacrylamide, styrene, alkylene glycol monoacrylates or alkylene glycol monomethacrylates. Very suitable photopolymerizable mixtures contain 10 to 50 percent and particularly 20 to 40 percent by weight of monomers and 90 to 50 percent and particularly 80 to 60 percent by weight of solid polymers such as soluble polyamides.

Examples of suitable photoinitiators are compounds which decompose into radicals under the action of air and initiate polymerization, for example vicinal ketaldonyl compounds such as diacetyl or benzil; α-ketaldonyl alcohols such as benzoin; acyloin ethers such as benzoin methyl ether; or substituted aromatic acyloins such as α-methylbenzoin. The photoinitiators are generally used in amounts of from 0.01 to 10 percent, preferably from 0.01 to 3 percent, by weight with reference to the whole mixture.

Examples of conventional thermal polymerization inhibitors are hydroquinone, p-methoxyphenol, p-quinones, copper(I) chloride, methylene blue, β-naphthylamine, phenols, salts of N-nitrosocyclohexylhydroxylamine and others. The polymerization inhibitors are generally used in amounts of from 0.01 to 2.0 percent, preferably from 0.05 to 0.5 percent, by weight with reference to the whole mixture.

Plates, sheeting or film containing indigoid dyes in accordance with this invention may be prepared by conventional methods, for example by dissolving the components, removing the solvent and then press-molding, extruding or rolling the finely divided mixture. Solutions of the components may also be cast into sheeting or film. The indigoid dyes are preferably added to the solutions of the components prior to their processing into light-sensitive layers. They may however be added at a later point in time to the finished mixture immediately prior to the production of the light-sensitive layers. Obviously care must be taken to ensure a homogeneous distribution of the dye in all cases.

Lamps giving high-energy radiation such as carbon are lamps, mercury vapor lamps, xenon lamps or fluorescent tubes may be used for the exposure.

The invention is illustrated by the following example. The parts specified in the example are by weight.

EXAMPLE

One hundred parts of a copolyamide (soluble in aqueous alcohols) from equal parts of caprolactam, the salt of hexamethylenediamine and adipic acid and the salt of 4,4'-diaminodicyclohexylmethane and adipic acid, 15 parts of m-xylylenebisacrylamide, 11 parts of triethyleneglycol bisacrylamide, 28 parts of the diether from ethylene glycol and methylolacrylamide, 13 parts of N-methoxymethyl methacrylamide, 1 part of benzoin methyl ether, 0.1 part of the cyclohexylammonium salt of N-nitrosocyclohexylhydroxylamine are dissolved in 300 ml. of methanol and 60 ml. of water. The amount and type of indigoid dye added may be seen from the following table. Light-sensitive layers or plates are prepared from the mixture by evaporation and press-molding.

In the table: Add = amount added in percent; Before = color of the printing plate prior to exposure; After = color of the printing plate after exposure; AC = almost colorless; C = colorless; PG = pale greenish; GB = green blue; B = blue; R = red.

TABLE

| Dye | Add | Before | After |
|---|---|---|---|
| Indigo | 0.001 | PG | AC |
| | 0.002 | PG | AC |
| | 0.003 | GB | AC |
| | 0.004 | B | AC |
| | 0.005 | B | AC |
| No addition | 0.000 | No optical effect | |
| 4,4'-dichloroindigo | 0.01 | B | AC |
| 5,5'-dibromoindigo | 0.01 | B | AC |
| 5,5',7,7'-tetrachloroindigo | 0.01 | B | AC |
| 5,5',7,7'-tetrabromoindigo | 0.01 | GB | AC |
| 4,4'-dichloro-5,5'-dibromoindigo | 0.01 | GB | AC |
| Thioindigo | 0.01 | R | AC |
| Disodium salt of 5,5'-indigodisulfonic acid. | 0.01 | B | C |
| | 0.02 | B | C |
| | 0.04 | B | C |
| | 0.06 | B | C |
| | 0.08 | B | C |
| | 0.10 | B | C |

While fresh plates exhibit a decoloration pattern after having been exposed for only 3 minutes through a negative by means of a fluorescent lamp Philips TLA 40 watt, plates which have kept for 6 months at 40° C. can be exposed for 20 minutes without the decoloration pattern being observed.

The plates cross link by polymerization even when kept in the dark. Product-specific calibration curves can be prepared for the exposure time in dependence on the age of the plates and these can be correlated to the measured photopolymerization heat.

The calibration curves permit direct determination of the necessary exposure time in dependence on the time which is necessary for decoloration of the plates at the exposed areas. As regards conventional photopolymerizable mixtures containing polyamide material it can be said that quite generally the plates are completely useless when no sharp decoloration pattern occurs after exposure for 10 minutes.

I claim:

1. A solid or semisolid photopolymerizable composition in the form of a film or sheet for use in producing relief printing plates, said composition comprising a mixture of (a) a photopolymerizable compound having at least two polymerizable olefinic double bonds; (b) 0.01 to 10 percent by weight with reference to said photopolymerizable composition of a photoinitiator, and (c) 0.001 to 5.0 percent by weight based on the weight of said photopolymerizable composition of an indigoid dye homogeneously dispersed in said mixture.

2. A solid or semisolid photopolymerizable composition in the form of a film or sheet for use in producing relief printing plates, said composition comprising a mixture of (a) 10 to 50 percent by weight of a photopolymerizable compound having at least two polymerizable olefinic double bonds and 90 to 50 percent by weight of a solid polymer; (b) 0.01 to 10 percent by weight with reference to the mixture of a photoinitiator, and (c) 0.001 to 5.0 percent by weight based on the weight of said photopolymerizable composition of an indigoid dye homogeneously dispersed in said mixture.

3. A layer as claimed in claim 2 containing indigo.

4. A layer as claimed in claim 2 containing the sodium salt of an indigosulfonic acid.

5. A layer as claimed in claim 2 containing the disodium salt of 5,5'-indigodisulfonic acid.

6. A layer as claimed in claim 2 containing a halogen derivative of indigo.

7. A layer as claimed in claim 2 containing 4,4'-dichloroindigo.

8. A layer as claimed in claim 2 containing 5,5'-dibromoindigo.

9. A layer as claimed in claim 2 containing 5,5',7,7'-tetrachloroindigo.

10. A layer as claimed in claim 2 containing 5,5',7,7'-tetrabromoindigo.

11. A layer as claimed in claim 2 containing thioindigo.

12. In a process for photopolymerizing a photopolymerizable composition by exposure to high-energy irradiation to produce a relief printing plate, wherein said composition comprises a mixture of (a) 10 to 50 percent by weight of a photopolymerizable compound having at least two polymerizable olefinic double bonds and 90 to 50 percent by weight of a solid polymer; (b) 0.01 to 10 percent by weight with reference to the mixture of a photoinitiator, and (c) 0.001 to 5.0 percent by weight based on the weight of said photopolymerizable composition of an indigoid dye homogeneously dispersed in said mixture, forming a film or sheet of said composition, and photopolymerizing said composition by exposure to high-energy irradiation, the improvement which comprises: (1) measuring the degree of decoloration of said composition from its original color against a precalibrated scale, and (2) using said degree of decoloration of said composition to determine the amount of irradiation needed to photopolymerize said composition to produce a hard printing relief.

* * * * *